(12) United States Patent
Feng et al.

(10) Patent No.: US 11,257,668 B2
(45) Date of Patent: Feb. 22, 2022

(54) SEMICONDUCTOR STRUCTURE AND MANUFACTURING METHOD THEREOF

(71) Applicant: Nexchip Semiconductor Co., LTD, Anhui (CN)

(72) Inventors: Yongbo Feng, Anhui (CN); Hongbo Zhu, Anhui (CN); Houyou Wang, Anhui (CN); Mingyang Tsai, Anhui (CN)

(73) Assignee: Nexchip Semiconductor Co., LTD, Hefei (CN)

( * ) Notice: Subject to any disclaimer, the term of this patent is extended or adjusted under 35 U.S.C. 154(b) by 0 days.

(21) Appl. No.: 16/917,928

(22) Filed: Jul. 1, 2020

(65) Prior Publication Data
US 2021/0375617 A1 Dec. 2, 2021

(30) Foreign Application Priority Data
May 26, 2020 (CN) .......................... 202010454977.6

(51) Int. Cl.
*H01L 21/8234* (2006.01)
*H01L 21/28* (2006.01)
*H01L 29/423* (2006.01)
*H01L 21/02* (2006.01)

(52) U.S. Cl.
CPC ............... *H01L 21/02126* (2013.01); *H01L 21/823462* (2013.01); *H01L 29/40117* (2019.08); *H01L 29/4234* (2013.01)

(58) Field of Classification Search
CPC .......... H01L 21/02126; H01L 29/4234; H01L 29/40117; H01L 21/823462
See application file for complete search history.

(56) References Cited

U.S. PATENT DOCUMENTS

2014/0308807 A1* 10/2014 Hu ..................... H01L 21/3105
 438/589
2018/0151581 A1* 5/2018 Wu .................. H01L 27/11541

* cited by examiner

*Primary Examiner* — David Vu

(57) ABSTRACT

The present disclosure provides a method for manufacturing a semiconductor structure. The method includes: providing a substrate includes a first region and a second region; forming a first polycrystalline silicon layer on the substrate, wherein the first polycrystalline silicon layer covers the first region and the second region; forming a stacked structure on the first polycrystalline silicon layer; forming a protective layer on the stacked structure; forming a patterned photoresist layer on the protective layer, wherein the patterned photoresist layer exposes the protective layer in the second region; removing the protective layer and the stacked structure in the second region to expose the first polycrystalline silicon layer in the second region; removing the patterned photoresist layer; and forming a second polycrystalline silicon layer on the protective layer in the first region and the first polycrystalline silicon layer in the second region.

8 Claims, 5 Drawing Sheets

SEMICONDUCTOR STRUCTURE AND MANUFACTURING METHOD THEREOF

CROSS REFERENCES TO RELATED APPLICATIONS

This application claims the benefit of priority to Chinese Patent Application No. CN 2020104549776, filed with CNIPO on May 26, 2020, the contents of which are incorporated herein by reference in its entirety.

TECHNICAL FIELD

The present disclosure relates to the technical field of semiconductor, in particular, to a semiconductor structure and a manufacturing method thereof.

BACKGROUND

With continuous improvement of requirements for the flash memory integration, traditional flash devices have conflicts between data storage reliability and working speed, power consumption and dimension. Silicon-Oxide-Nitride-Oxide-Silicon (SONOS) memory has small cell size, low operating voltage, and is compatibility with a CMOS technology. The continuous improvement of an SONOS technology promotes the semiconductor memory to develop towards miniaturization, high performance, large capacity, low cost, etc.

Reliability, as an important index of semiconductor devices, plays a key role in the stable and reliable operation of the devices. In a self-align SONOS memory, information is stored in the SONOS memory through an ONO layer, so the stability of the ONO layer is important to the stability of the device. However, according to existing methods for manufacturing ONO gate structures, the thickness of the ONO layer is easily influenced, thus affecting stability of the memory.

SUMMARY

The present disclosure provides a method for manufacturing a semiconductor structure. By this method, a thickness of an ONO layer is not influenced, and the stability of a device is improved.

The present disclosure provides a method for manufacturing the semiconductor structure, including: providing a substrate, the substrate includes a first region and a second region; forming a first polycrystalline silicon layer on the substrate, wherein the first polycrystalline silicon layer covers the first region and the second region; forming a stacked structure on the first polycrystalline silicon layer; forming a protective layer on the stacked structure; forming a patterned photoresist layer on the protective layer, wherein the patterned photoresist layer exposes the protective layer in the second region; removing the protective layer and the stacked structure in the second region to expose the first polycrystalline silicon layer in the second region; removing the patterned photoresist layer; and forming a second polycrystalline silicon layer on the protective layer in the first region and the first polycrystalline silicon layer in the second region.

Further, the protective layer is a polycrystalline silicon protective layer.

Further, after the patterned photoresist layer is removed, and before the second polycrystalline silicon layer is formed, the method further comprises a reducing step for reducing a native oxide layer. The native oxide layer is formed on the protective layer in the first region and the first polycrystalline silicon layer in the second region.

Further, the first region is a storage region, the second region is an operation region.

Further, the stacked structure sequentially comprises a first oxide layer, a nitride layer and a second oxide layer.

Further, the protective layer is disposed on the second oxide layer.

Further, a thickness of the protective layer is smaller than a thickness of the first polycrystalline silicon layer. The thickness of the protective layer is in a range of 5 nm to 10 nm.

Further, before forming the first polycrystalline silicon layer, the method further comprises forming a gate oxide layer on the substrate, the gate oxide layer covers the first region and the second region.

Further, before forming the gate oxide layer, the method further comprises forming a shallow trench isolation structure in the substrate, the shallow trench isolation structure isolates the first region from the second region.

The present disclosure further provides a semiconductor structure, comprising: a substrate, including a first region and a second region; an isolation structure, disposed in the substrate, and isolating the first region from the second region; a gate oxide layer, disposed on the substrate, and covering the first region and the second region; a first polycrystalline silicon layer, disposed on the gate oxide layer; a stacked structure, disposed on the first polycrystalline silicon layer on the first region; a protective layer, disposed on the stacked structure; and a second polycrystalline silicon layer, positioned on the protective layer and the first polycrystalline silicon layer in the second region.

Based on the above, the present disclosure provides the method for manufacturing the semiconductor structure. The manufacturing method is applicable to the semiconductor structure with at least two polycrystalline silicon layers. The protective layer is formed on the stacked structure, so that the protective layer can protect the second oxide layer in the stacked layer from being influenced in the reducing step. If no protective layer exists on the stacked structure, the second oxide layer in the stacked structure will be reduced in the reducing step, which will reduce the thickness of the second oxide layer. That is, the thickness of the stacked structure will be reduced. Therefore, through the protective layer formed on the stacked structure, the thickness of the stacked structure is decreased, the stability of a memory is improved.

LIST OF REFERENCE NUMERALS

Figure 1:
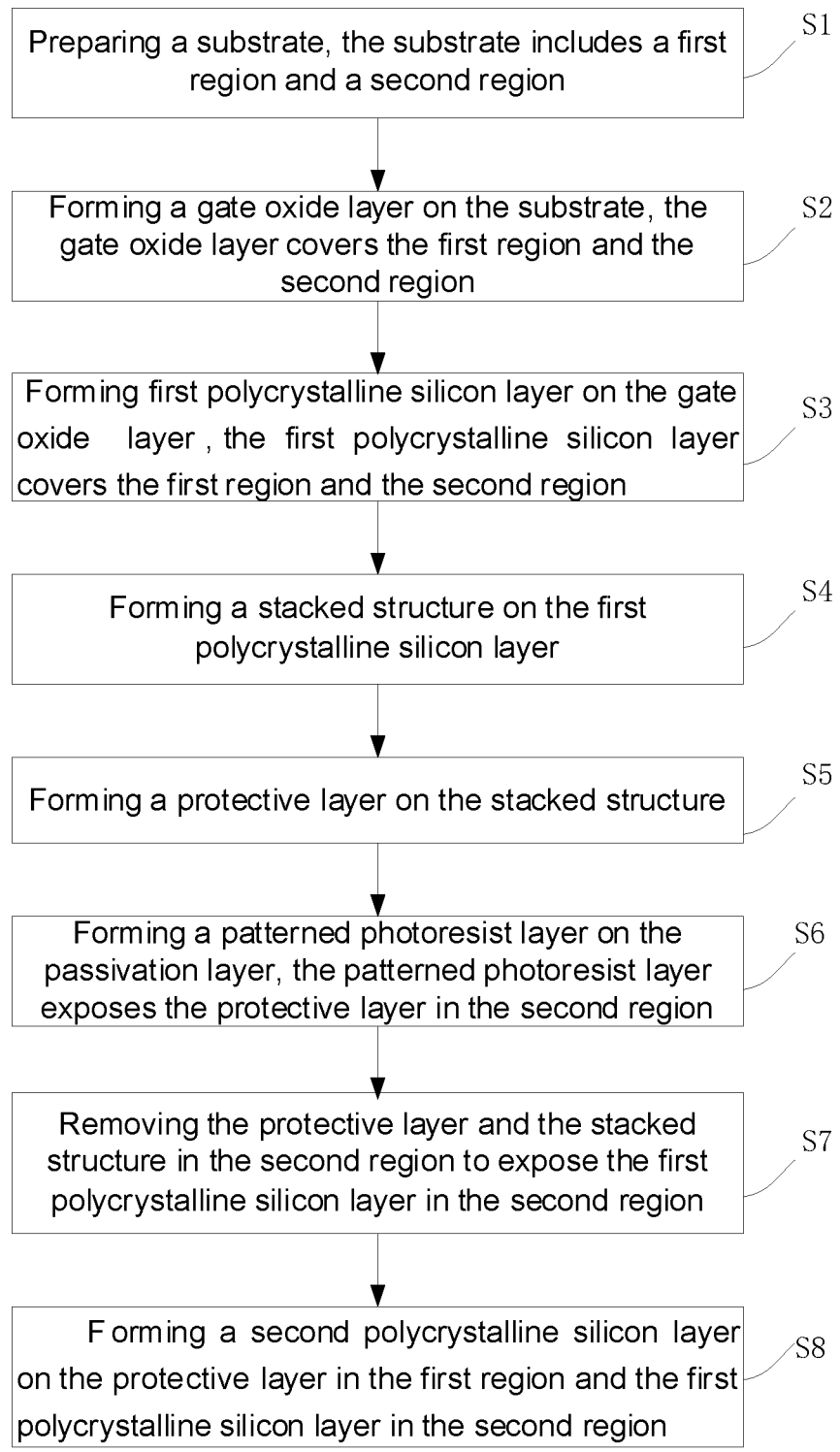
FIG. 1 is a flow diagram of a method for manufacturing a semiconductor structure according to the present embodiment.

10 Middle semiconductor structure
1051 First oxide layer
100 Semiconductor structure
1052 Nitride layer
100a First region
1053 Second oxide layer
100b Second region
106 Protective layer
101 Substrate
106a Patterned photoresist layer
102 Shallow trench isolation structure
107 Natural oxide layer
103 Gate oxide layer
108 Second polycrystalline silicon layer
104 First polycrystalline silicon layer
105 Stacked structure

DETAILED DESCRIPTION OF THE PREFERRED EMBODIMENTS

The following describes the embodiments of the present disclosure through specific examples. A person skilled in the art can easily understand other advantages and effects of the present disclosure from the content disclosed in this specification. The present disclosure may also be implemented or applied through different specific embodiments. Various details in this specification may also be modified or changed based on different viewpoints and applications without departing from the spirit of the present disclosure.

It should be noted that the drawings provided in this embodiment only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

The present disclosure provides a method for manufacturing a semiconductor structure. The method is suitable for manufacturing various kinds of memories, such as nonvolatile memories, programmable read-only memories, erasable programmable read only memories and flash memories. The flash memories can be, for example, used as nonvolatile memories. The non-volatile memories can be, for example, used in computers, mobile communication terminals, memory cards, etc. The method for manufacturing the semiconductor structure according to the present disclosure is suitable for manufacturing a memory including a double-layer polycrystalline silicon layer, and a memory including a three-layer or more-than-three-layer polycrystalline silicon layer.

As shown in FIG. 1, the method for manufacturing a semiconductor structure according to the present embodiment includes:

S1: providing a substrate. The substrate includes a first region and a second region.

S2: forming a gate oxide layer on the substrate. The gate oxide layer covers the first region and the second region.

S3: forming a first polycrystalline silicon layer on the gate oxide layer. The first polycrystalline silicon layer covers the first region and the second region.

S4: forming a stacked structure on the first polycrystalline silicon layer.

S5: forming a protective layer on the stacked structure.

S6: forming a patterned photoresist layer on the protective layer. The patterned photoresist layer exposes the protective layer in the second region.

S7: removing the protective layer and the stacked structure in the second region to expose the first polycrystalline silicon layer in the second region.

S8: forming a second polycrystalline silicon layer on the protective layer in the first region and the first polycrystalline silicon layer in the second region.

Figure 2:
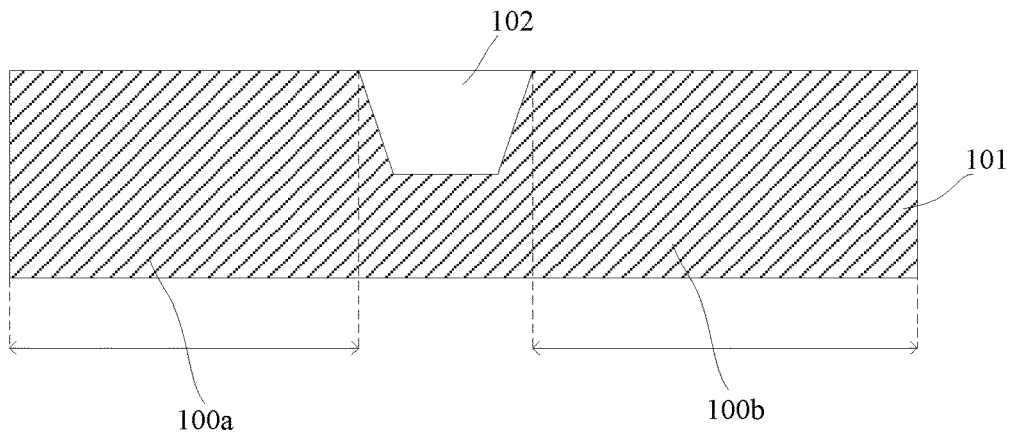
FIG. 2 is a schematic diagram of a structure corresponding to step S1.

As shown in FIG. 2, in step S1, a substrate 101 is firstly provided. The substrate 101 at least includes a shallow trench isolation structure 102. The shallow trench isolation structure 102 divided the substrate 101 into a first region 100a and a second region 100b. That is, the first region 100a and the second region 100b are respectively positioned at two sides of the shallow trench isolation structure 102. In the present embodiment, the region at the left side of the shallow trench isolation structure 102 is defined as the first region 100a, and the region at the right side of the shallow trench isolation structure 102 is defined as the second region 100b. In some embodiments, the region at the right side of the shallow trench isolation structure 102 may be defined as the first region 100a, and the region at the left side of the shallow trench isolation structure 102 may be defined as the second region 100b.

As shown in FIG. 2, in the present embodiment, the material of the substrate 101 may include, but is not limited to, a monocrystalline or polycrystalline semiconductor material. The substrate 101 may be an intrinsic monocrystalline silicon substrate or a doped silicon substrate. Specifically, the substrate 101 may be a substrate of a first doped type. The first doped type may be a P type or an N type. The present embodiment takes the first doped type of the P type as an example. That is, in the present embodiment, the substrate 101 takes a P type substrate as an example. In the present embodiment, the shallow trench isolation structure 102 may be formed by forming trenches (not shown) in the substrate 101 and then filling the trenches with an isolation material. The material of the shallow trench isolation structure 102 may contain silicon nitride, silicon oxide or silicon oxynitride. In the present embodiment, the material of the shallow trench isolation structure 102 includes silicon oxides. The shape of a longitudinal cross section of the shallow trench isolation structure 102 may be set according to practical requirements. In FIG. 2, as an example, the shape of the longitudinal cross section of the shallow trench isolation structure 102 is an inverted trapezoidal shape. In other examples, the shape of the longitudinal cross section of the shallow trench isolation structure 102 may be a U shape, etc.

As shown in FIG. 2, in some embodiments, the material of the substrate 101 is, for example, silicon, silicon germanium, silicon on isolator (SOI), silicon germanium on isolator (SGOI) or germanium on insulator (GOI). In some embodiments, the shallow trench isolation structure 102 is replaced with an insulation medium isolation structure. The material of the shallow trench isolation structure 102 at least includes silicon oxide.

Figure 3:
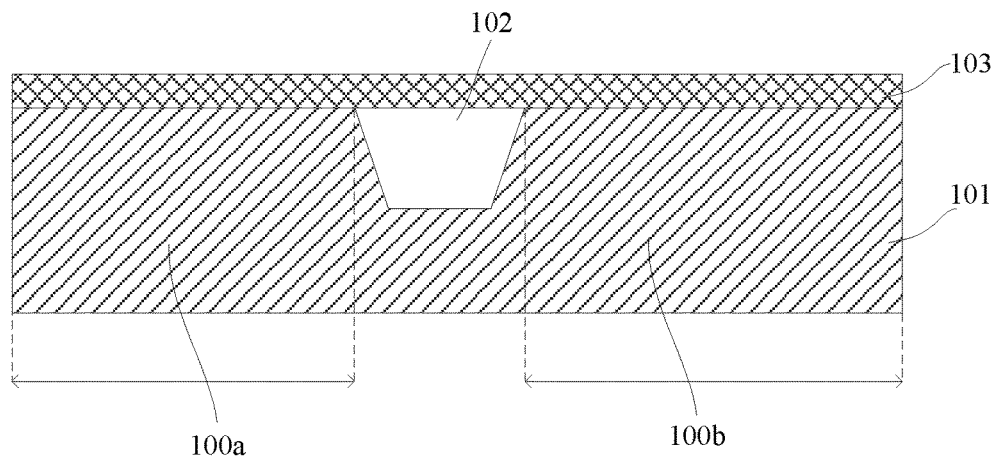
FIG. 3 is a schematic diagram of a structure corresponding to step S2.

As shown in FIG. 3, in step S2, a gate oxide layer 103 is formed on the substrate 101. The gate oxide layer 103 covers the first region 100a and the second region 100b. The material of the gate oxide layer 103 may include, but is not limited to, silicon oxide or silicon oxynitride. In the present embodiments, the gate oxide layer 103 may be formed, for example, by a thermal oxidation growth method. For example, in a thermal oxidation environment, the substrate 101 is oxidized by nitrous oxides, and the gate oxide layer 103 is formed on the substrate 101. The thickness of the gate oxide layer 103 may be, for example, in a range of 2 nm to 18 nm, and is, for example, 8 nm or 15 nm. Certainly, the thickness of the gate oxide layer 103 may be set according to practical requirements.

As shown in FIG. 3, in some embodiments, after the gate oxide layer 103 is formed, the gate oxide layer 103 may be subjected to nitridation treatment. Then, a stacked structure is formed on the nitriding gate oxide layer 103. It should be noted that for the nitridation treatment refers to annealing the gate oxide layer 103 in an atmosphere of $N_2$, $N_2O$ or $NO_2$. An annealing temperature range is, for example, 800° C. to 1000° C. After forming a nitrogenous region (not shown) in the gate oxide layer 103 and near a surface of the substrate 101, reliability of the gate oxide layer 103 in a memory cell unit is improved and data storage capability of a memory cell of a flash memory in a cycle operation in enhanced. The nitrogenous regions are positioned at two sides of the shallow trench isolation region 102. That is, nitrogenous regions (not shown) are formed on tops of the substrate 101 both in the first region 100a and the second region 100b which are in contact with the gate oxide layer 103.

Figure 4:
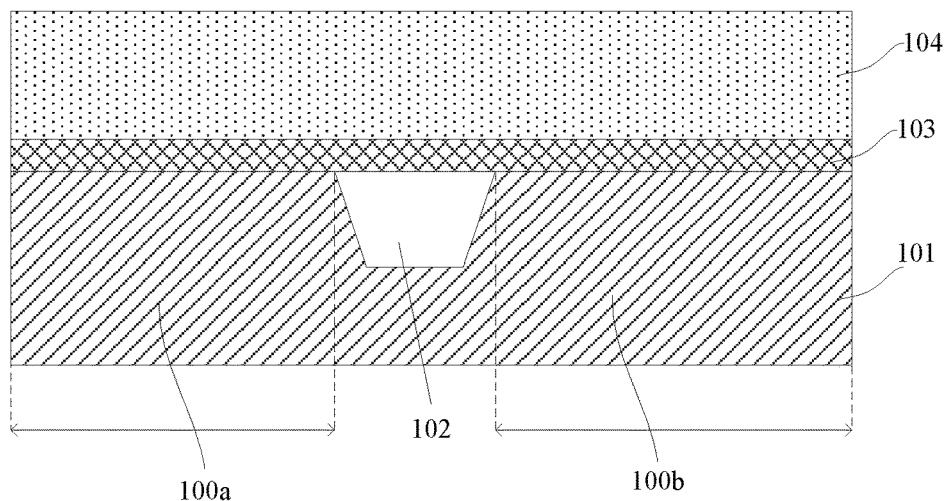
FIG. 4 is a schematic diagram of a structure corresponding to step S3.

As shown in FIG. 4, in step S3, after the gate oxide layer 103 is formed, a first polycrystalline silicon layer 104 is formed on the gate oxide layer 103. The first polycrystalline silicon layer 104 covers the first region 100a and the second region 100b. The thickness of the first polycrystalline silicon layer 104 is greater than the thickness of the gate oxide layer 103. In the present embodiment, the first polycrystalline silicon layer 104 may be a polycrystalline silicon layer of a second doped type. That is, the doped type of the first polycrystalline silicon layer 104 is different from the doped type of the substrate 101. The second doped type may be a P type, or may be an N type. When the first doped type is the P type, the second doped type is the N type. When the first doped type is the N type, the second doped type is the P type. In the present embodiment, for example, silane may be used as a reaction gas to form the first polycrystalline silicon layer 104. The thickness of the first polycrystalline silicon layer 104 may be, for example, in a range of 200 nm to 500 nm, and preferably, be 300 nm or 400 nm. Certainly, the thickness of the first polycrystalline silicon layer 104 may be set according to practical requirements. In the present embodiment, the first polycrystalline silicon layer 104 is configured to form a floating gate electrode of the memory.

Figure 5:
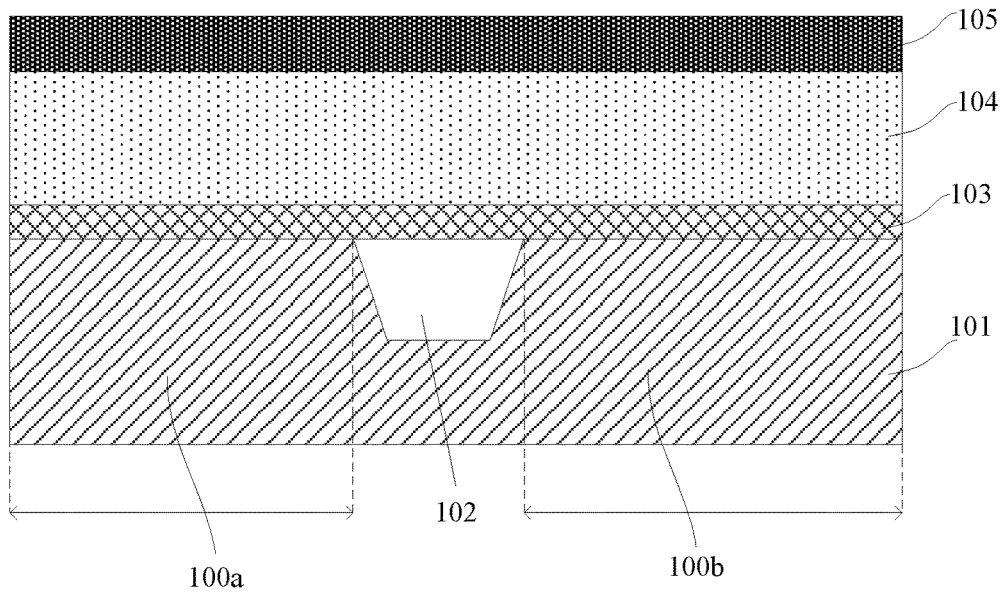
FIG. 5 is a schematic diagram of a structure corresponding to step S4.
Figure 6:
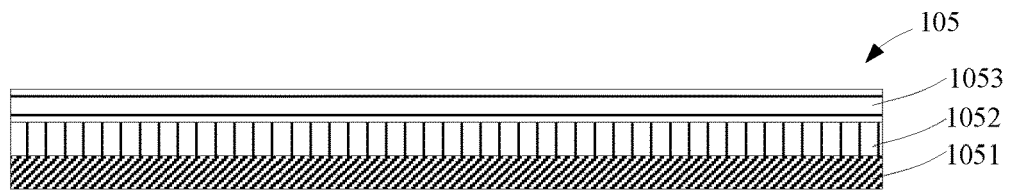
FIG. 6 is a brief schematic diagram of a stacked structure.

As shown in FIG. 5 and FIG. 6, in step S4, after the first polycrystalline silicon layer 104 is formed, a stacked structure 105 is formed on the first polycrystalline silicon layer 104. The stacked structure 105 is of an oxide-nitride-oxide structure. The stacked structure 105 sequentially includes a first oxide layer 1051, a nitride layer 1052 and a second oxide layer 1053. The first oxide layer 1051 is disposed on the first polycrystalline silicon layer 104. The nitride layer 1052 is disposed on the first oxide layer 1051. The second oxide layer 1053 is disposed on the nitride layer 1052. The first oxide layer 1051 is, for example, a silicon oxide layer. The nitride layer 1052 is, for example, a silicon nitride layer. The second oxide layer 1053 is, for example, a silicon oxide layer. In some embodiments, the first oxide layer 1051 may be defined as a bottom oxide layer, and the second oxide layer 1053 may be defined as a top oxide layer.

As shown in FIG. 5, in some embodiments, the stacked structure 105 may be defined as an inter-gate medium layer. The inter-gate medium layer may contain a single-layer structure or a stacked-layer structure. When the inter-gate medium layer is of a single-layer structure, the inter-gate medium layer is a silicon oxide layer. When the inter-gate medium layer is of a stacked-layer structure, the inter-gate medium layer is of a double-layer structure formed by a silicon oxide layer and a silicon nitride layer or a three-layer structure formed by a silicon oxide layer, a nitride silicon layer and a silicon oxide layer.

As shown in FIG. 5 and FIG. 6, in the present embodiment, before the first oxide layer 1051 is formed, the first polycrystalline silicon layer 104 may be cleaned to improve the forming quality of the stacked structure 105. In the present embodiment, the first oxide layer 1051 may be formed on the first polycrystalline silicon layer 104 by thermal oxide growth, chemical vapor deposition, or atomic layer deposition. The material of the first oxide layer 1051 is, for example, silicon oxides. The thickness of the first oxide layer 1051 is, for example, in a range of 2 nm to 5 nm. After the first oxide layer 1051 is formed, the nitride layer 1052 may be directly formed on the first oxide layer 1051, for example, by using a mixed gas including dichlorosilane ($SiH_2Cl_2$, DCS) and ammonia gas ($NH_3$). After the nitride layer 1052 is formed, the second oxide layer 1053 is formed on the nitride layer 1052. The second oxide layer 1053 may be formed by semiconductor film manufacturing processes, for example, thermal oxide growth, chemical vapor deposition (CVD), atomic layer deposition (ALD) or the like. The thickness of the second oxide layer 1053 may be in a range of 2 nm to 5 nm. The material of the second oxide layer 1053 is, for example, silicon oxides.

FIG. 6 shows a schematic diagram of a stacked structure 105 in the present embodiment. The stacked structure 105 is an oxide-nitride-oxide (ONO) structure. In the present embodiment, the stacked structure 105 sequentially includes a first oxide layer 1051, a nitride layer 1052 and a third oxide layer 1053 from bottom to top. In some embodiments, the nitride layer 1052 may be divided into a first silicon nitride layer and a second silicon nitride layer. That is, the stacked structure 105 sequentially includes a first oxide layer 1051, a first silicon nitride layer, a second silicon nitride layer and a second oxide layer 1053 from bottom to top.

Figure 7:
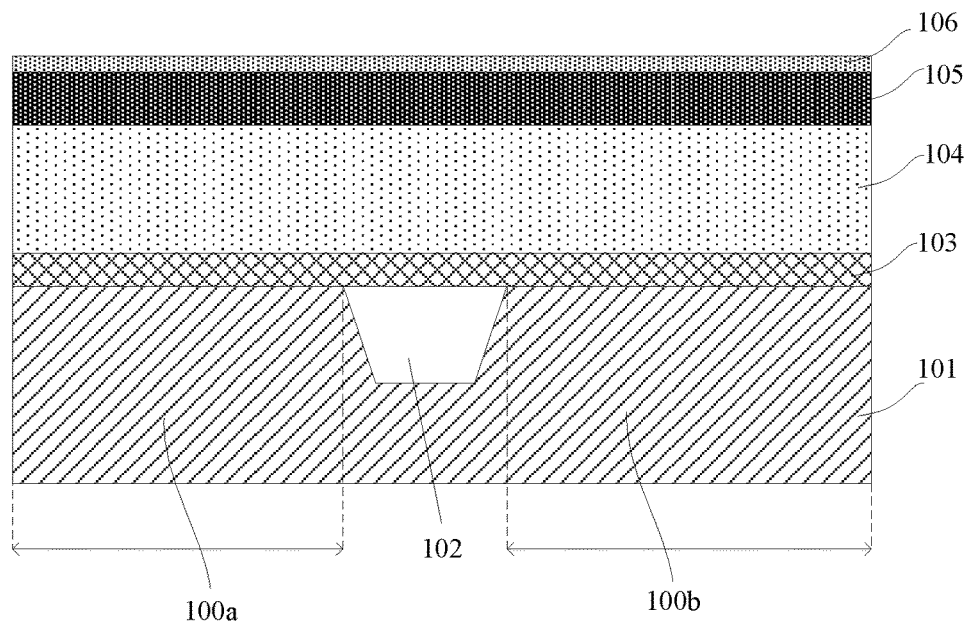
FIG. 7 is a schematic diagram of a structure corresponding to step S5.

As shown in FIG. 7, in step S5, after the stacked structure 105 is formed, a protective layer 106 is formed on the stacked structure 105. The protective layer 106 is configured to protect the stacked structure 105. That is, the protective layer 106 is configured to prevent subsequent operation from influencing the second oxide layer 1053 in the stacked structure 105. In other words, the thickness of the stacked structure is not changed. In the present embodiment, the protective layer 106 may be, for example, a polycrystalline silicon layer. The doped type of the protective layer 106 may be different from the doped type of the first polycrystalline silicon layer 104. In the present embodiment, the thickness of the protective layer 106 is smaller than the thickness of the stacked structure 105. The thickness of the stacked layer 105 may be smaller than the thickness of the first polycrystalline silicon layer 104. The thickness of the protective layer 106 may be, for example, in a range of 5 nm to 10 nm.

Figure 8:
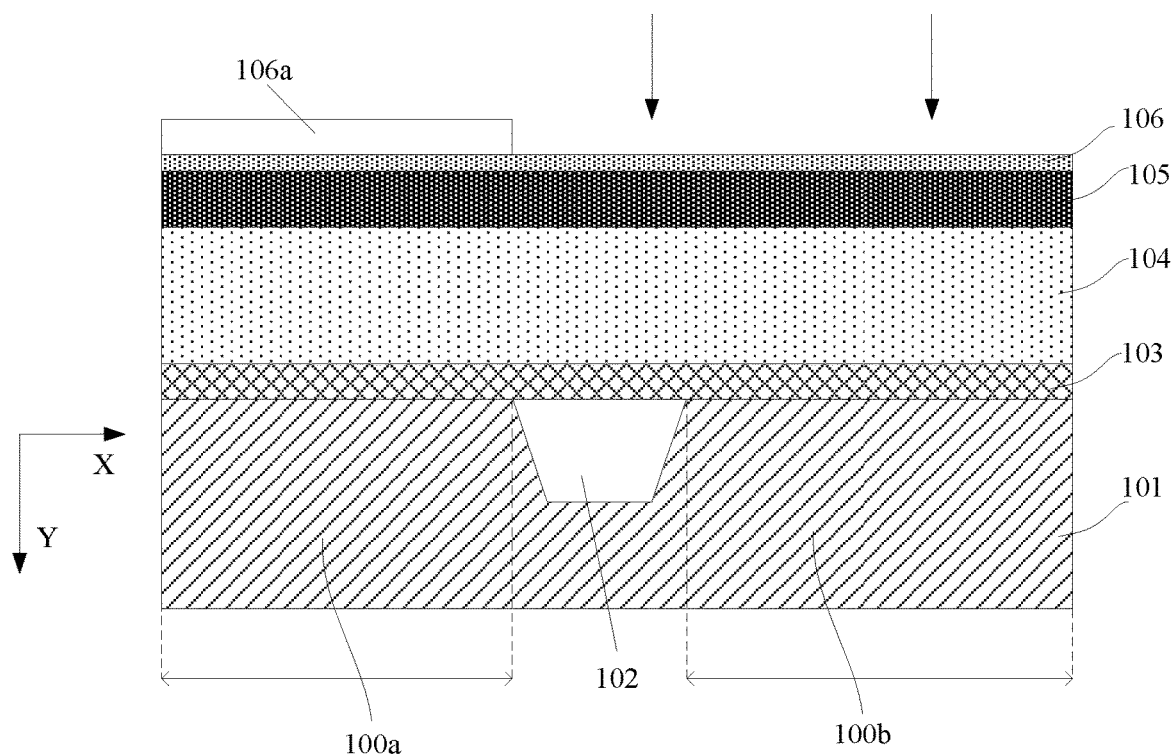
FIG. 8 is a schematic diagram of a structure corresponding to step S6.

As shown in FIG. 8, in steps S6 to S7, after the protective layer 106 is formed, a patterned photoresist layer 106a is formed on the protective layer 106. The patterned photoresist layer 106a does not completely cover the protective layer 106. That is, the patterned photoresist layer 106a exposes part of the protective layer 106. Then, the exposed protective layer 106 is downwards etched through an etching process. That is, the exposed protective layer 106 and the stacked structure 105 positioned right under the exposed protective layer 106 are removed to expose a surface of the first polycrystalline silicon layer 104.

As shown in FIG. 8, in the present embodiment, the patterned photoresist layer 106a is disposed on the protective layer 106. Specifically, the patterned photoresist layer 106a is disposed at one side of the shallow trench isolation structure 102. More specifically, the patterned photoresist layer 106a is disposed on the protective layer 106 in the first region 100a. That is, the first region 100a is disposed right under the patterned photoresist layer 106a. Therefore, the protective layer 106 disposed on the shallow trench isolation structure 102 and the second region 100b is exposed. Arrows in FIG. 8 show an etching direction. In the present embodiment, the protective layer 106 disposed on the shallow trench isolation structure 102 and the second region 100b may be removed, for example, by wet process etching to expose the first polycrystalline silicon layer 104 disposed on the shallow trench isolation structure 102 and the second region 100b. It should be noted that the statement that the first region 100a is positioned right under the photoresist layer 106a refers to that the first region 100a is positioned in a projection region of the patterned photoresist layer 106a in a direction Y.

As shown in FIG. 8, in the present embodiment, after the patterned photoresist layer 106a is formed on the protective layer 106, the first region 100a is defined as a storage region, and the second region 100b is defined as an operation region. That is, the storage region and the operation region are positioned at the two sides of the shallow trench isolation structure 102. The storage region is configured to form a storage structure of a memory. The operation region may be configured to form an operation circuit of the memory. In some embodiments, the patterned photoresist layer 106a may be positioned on the protective layer 106 in the second region 100b, in this case, the second region 100b is defined as the storage region, and the first region 100a is defined as the operation region.

Figure 9:
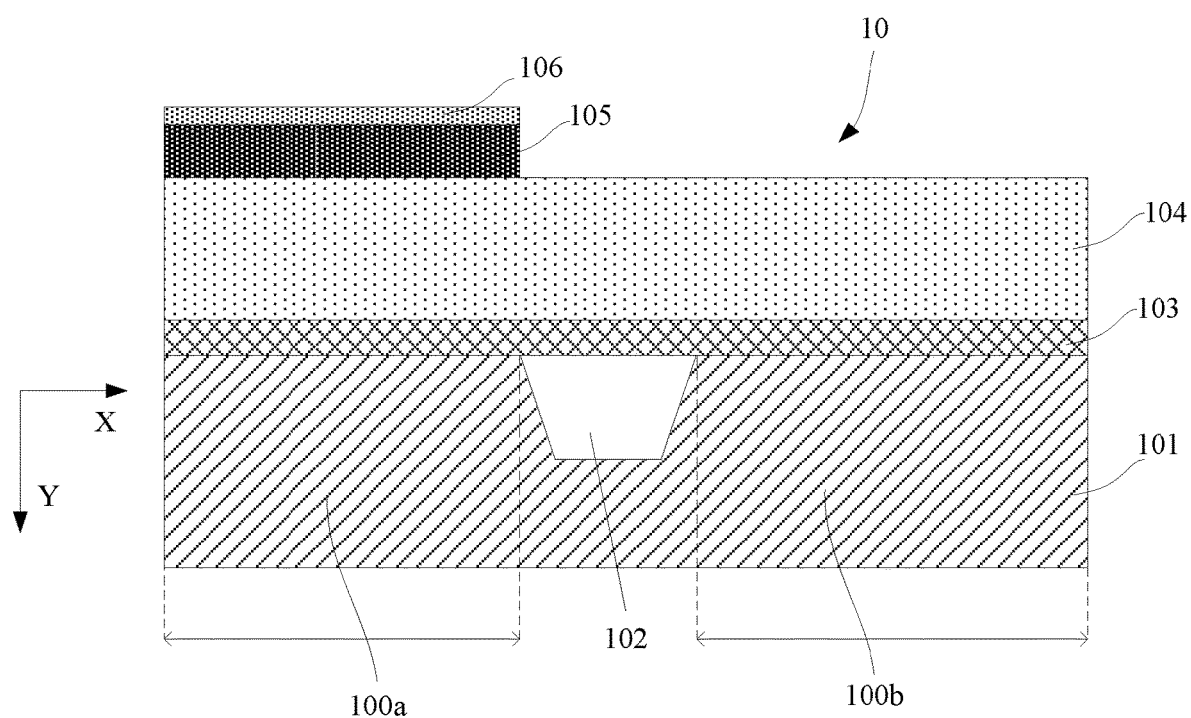
FIG. 9 is a schematic diagram of a structure corresponding to step S7.

FIG. 9 shows a structure diagram after removing the stacked structure 105 and the protective layer 106 on the second region 100b. The structure is defined as a middle semiconductor structure 10. The middle semiconductor structure 10 includes a substrate 101. The substrate 101 includes a first shallow trench isolation structure 102, a first region 100a and a second region 100b. The first region 100a and the second region 100b are respectively positioned at two sides of the shallow trench isolation structure 102. The middle semiconductor structure 10 further includes a gate oxide layer 103, a first polycrystalline silicon layer 104, a stacked structure 105 and a protective layer 106. The gate oxide layer 103 is disposed on the substrate 101. The gate oxide layer 103 covers the first region 100a and the second region 100b. The first polycrystalline silicon layer 104 is disposed on the gate oxide layer 103. The stacked structure 105 is disposed on the first polycrystalline silicon layer 104 in the first region 100a. The protective layer 106 is disposed on the stacked structure 105. It can be seen from FIG. 9 that the stacked structure 105 does not cover the shallow trench isolation structure 102. That is, the stacked structure 105 is disposed at one side of the shallow trench isolation structure 102. In other words, the stacked structure 105 is disposed on the first polycrystalline silicon layer 104 in the first region 100a. According to the present embodiment, a region in the substrate 101 corresponding to the stacked structure 105 may be defined as a storage region. That is, a region in the substrate 101 positioned right under the stacked structure 105 is defined as a storage region. In other words, the first region 100a is defined as the storage region. At the same time, the second region 100b is defined as an operation region. The storage region and the operation region are respectively positioned at two sides of the shallow trench isolation structure 102. The storage region is configured to form a storage structure of the memory. The operation region is configured to form an operation circuit of the memory. Alternatively, in some embodiments, when the second region 100b is positioned right under the stacked structure 105, the second region 100b may be defined as the storage region, and the first region 100a is defined as the operation region. The first region 100a is positioned right under the stacked layer 105 refers to that the first region 100a is positioned in a projection region of the stacked structure in a direction Y.

Figure 10:
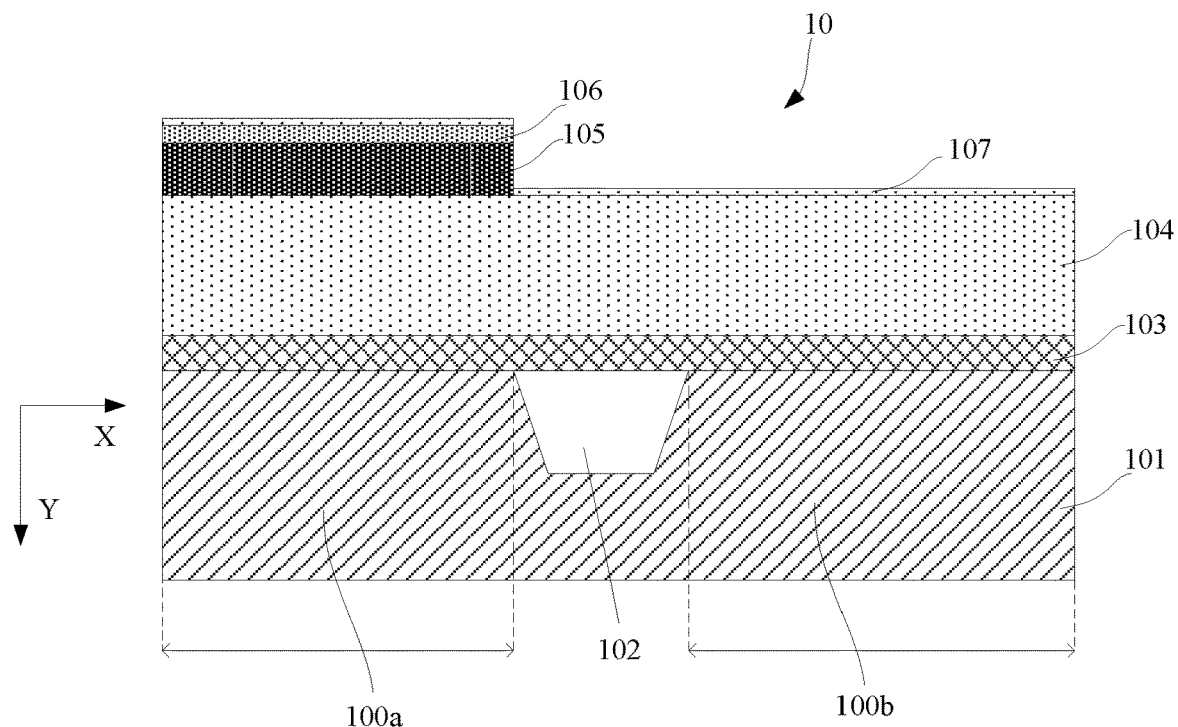
FIG. 10 is a schematic diagram of a structure after forming a native oxide layer.

As shown in FIG. 10, in the present embodiment, after the middle semiconductor structure 10 is formed, the middle semiconductor structure 10 cannot be immediately subjected to a next step of process. That is, before the next step, a preset time needs to be waited. In the present embodiment, a period of time needs to be waited before forming a second polycrystalline silicon layer. The time after the middle semiconductor structure 10 is formed and before depositing the second polycrystalline silicon layer is defined as a queue time (Q-time). In the queue time (Q-time), the first polycrystalline silicon layer 104 and the protective layer 106 on the middle semiconductor structure 10 are polycrystalline silicon, so that oxidization phenomena may occur on the surfaces of the first polycrystalline silicon layer 104 positioned on the shallow trench isolation structure 102 and the second region 100b and the protective layer 106 positioned on the first region 100a. That is, a native oxide layer 107 is formed on the surfaces of the first polycrystalline silicon layer 104 and the protective layer 106. In the present embodiment, the native oxide layer 107 is, for example, a silicon oxide layer. The thickness of the native oxide layer 107 is smaller than the thickness of the protective layer 106.

Figure 11:
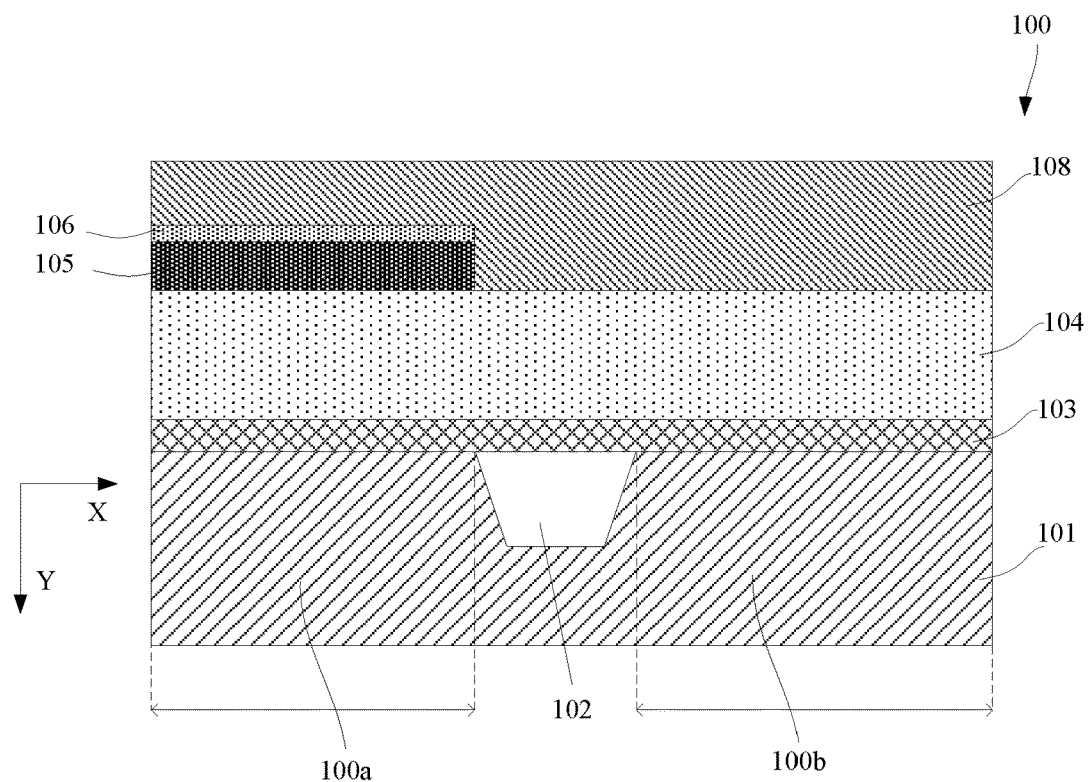
FIG. 11 is a schematic diagram of a structure corresponding to step S8.

As shown in FIG. 6, FIG. 10 and FIG. 11, in step S8, after the preset time, the second polycrystalline silicon layer 108 may be formed on the middle semiconductor structure 10. It should be noted that before the second polycrystalline silicon layer 108 is formed, the native oxide layer 107 needs to be removed. In the present embodiment, for example, the middle semiconductor structure 10 may be put in a reducing atmosphere, and the reducing gas takes a reaction with the native oxide layer 107. That is, the silicon oxides are reduced into silicon, so that the native oxide layer 107 is removed. In the present embodiment, the protective layer 106 is disposed on the top of the stacked structure 105. The protective layer 106 is polycrystalline silicon. Therefore, after the native oxide layer 107 above the protective layer 106 is reduced by the reducing gas, due to a barrier effect of the protective layer 106, the reducing gas cannot react with a second oxide layer 1053 in the stacked structure 105. In other words, the stability of the stacked structure 105 can be ensured through the protective layer 106, the thickness of the stacked structure 105 is not changed in the reducing process.

As shown in FIG. 6 and FIG. 10, in the present embodiment, if no protective layer 106 is formed on the middle semiconductor structure 10, when the middle semiconductor structure 10 waits for the next process, the native oxide layer 107 may be formed on the first polycrystalline silicon layer 104 of the middle semiconductor structure 10 in the second region 100b. When the native oxide layer 107 is removed through a reducing gas, the reducing gas can reduce the second oxide layer 1053 in the stacked structure 105 into silicon. Therefore, the thickness of the second oxide layer 1053 is reduced. That is, the thickness of the stacked structure 105 is reduced. In result, the electric stability of the device is reduced. The stacked structure 105 is configured to store information. The stability of the stacked structure 105 determines the stability of the memory.

As shown in FIG. 10, a native oxide layer 107 may be formed on the protective layer 106. When the native oxide layer 107 is removed through a reducing gas, the thickness of the protective layer 106 may decrease, but the thickness of the stacked structure 105 may not change. That is, the stability of the stacked structure 105 can be ensured, therefore ensuring the stability of the memory. In the present embodiment, the reducing gas is, for example, hydrogen gas. Due to the protective layer 106, the time of the reducing process may be prolonged, therefore, the native oxide layer is completely removed, and an interface between the first polycrystalline silicon layer 104 and the second polycrystalline silicon layer 108 is avoided.

As shown in FIG. 11, in step S8, after the native oxide layer 107 is completely removed, the second polycrystalline silicon layer 108 is formed on the first polycrystalline silicon layer 104 and the protective layer 106. In the present embodiment, the doped type of the second polycrystalline silicon layer 108 may be same to the doped type of the first polycrystalline silicon layer 104, or may be different. The doped type of the second polycrystalline silicon layer 108 may be same to the doped type of the protective layer 106, or may be different. In the present embodiment, the second polycrystalline silicon layer 108 on the first region 100a is disposed on the protective layer 106. The second polycrystalline silicon layer 108 in the second region 100b is disposed on the first polycrystalline silicon layer 104. The stacked structure 105 and the protective layer 106 are disposed between the first polycrystalline silicon layer 104 and the second polycrystalline silicon layer 108. The thickness of the second polycrystalline silicon layer 108 is, for example, in a range of 200 nm to 500 nm. The second polycrystalline silicon layer 108 is configured to form a control gate electrode of the memory.

FIG. 11 shows a structure diagram of a semiconductor structure 100 provided in the present embodiment. The semiconductor structure 100 includes a substrate 101. The substrate 100 includes a shallow trench isolation structure 102, a first region 100a and a second region are comprised in the substrate 101. The first region 100a and the second region 100b are respectively positioned at two sides of the shallow trench isolation structure 102. In the present embodiment, the material of the substrate 101 is, for example, monocrystalline or silicon on isolator (SOI), or may further contain other materials, such as indium antimonide, lead telluride, indium arsenide, indium phosphides, gallium arsenide or gallium antimonide. The shallow trench isolation structure 102 may include dielectric material, such as oxides or nitrides.

As shown in FIG. 11, the semiconductor structure 100 further comprises a gate oxide layer 103 and a first polycrystalline silicon layer 104. The gate oxide layer 103 is disposed on the substrate 101. The gate oxide layer 103 covers the first region 100a and the second region 100b. The first polycrystalline silicon layer 104 is disposed on the gate oxide layer 103. The thickness of the first polycrystalline silicon layer 104 is greater than the thickness of the gate oxide layer 103. The material of the gate oxide layer 103 is, for example, silicon oxides. In the present embodiment, the doped type of the first polycrystalline silicon layer 104 is different from the doped type of the substrate 101. When the substrate 101 is in a P type, the first polycrystalline silicon layer 104 is in an N type. When the substrate 101 is in the N type, the first polycrystalline silicon layer 104 is in the P type. The thickness of the gate oxide layer 103 is smaller than the thickness of the first polycrystalline silicon layer 104. The first polycrystalline silicon layer 104 may be configured to form a floating gate electrode of a memory. In some embodiments, the first polycrystalline silicon layer 104 may be polycrystalline silicon doped with impurity, thus having conductivity.

As shown in FIG. 11, the semiconductor structure 100 further includes a stacked structure 105 and a protective layer 106. The stacked structure 105 is disposed on the first polycrystalline silicon layer 104 in the first region 100a. The protective layer 106 is disposed on the stacked structure 105. The thickness of the protective layer 106 is smaller than the thickness of the stacked structure 105. The thickness of the stacked structure 105 is smaller than the thickness of the first polycrystalline silicon layer 104. The thickness of the protective layer 106 is, for example, in a range of 5 nm to 10 nm. The thickness of the stacked structure 105 is, for example, in a range of 120 nm to 150 nm. The thickness of the first polycrystalline silicon layer 104 is, for example, in a range of 200 to 500 nm. The stacked structure 105 may be an oxide-nitride-oxide structure, such as a silicon oxide-silicon nitride-silicon oxide structure. The stacked structure 105 has good breakdown voltage, leakage current and charge trapping characteristics. The protective layer 106 is a polycrystalline silicon layer. The doped type of the protective layer 106 may be same to the doped type of the first polycrystalline silicon layer 104, or may be different. In the present embodiment, the protective layer 106 is configured to protect the stacked structure 105 and prevent the second oxide layer in the stacked structure 105 from being reduced, so that the thickness of the stacked structure 105 is not changed. Therefore, the electrical performance of the memory is improved.

As shown in FIG. 11, in the present embodiment, the first region 100a is positioned right under the stacked structure 105. Therefore, the first region 100a is defined as a storage region, and the second region 100b is defined as an operation region. The storage region and the operation region are positioned at two sides of the shallow trench isolation structure 102. The first region 100a is positioned right under the stacked structure 105 refers to that the first region 100a is positioned in a projection region of the stacked structure 105 in a direction Y. In the present embodiment, the storage region is configured to form the storage structure of the memory, and the operation region is configured to form an operation circuit of the memory. In some embodiments, when the second region 100b is positioned right under the stacked structure 105, the second region 100b is defined as the storage region, and the first region 100a is defined as the operation region.

As shown in FIG. 11, the semiconductor structure 100 further includes a second polycrystalline silicon layer 108. The second polycrystalline silicon layer 108 in the first region 100a is disposed on the protective layer 106. The second polycrystalline silicon layer 108 in the second region 100b is disposed on the first polycrystalline silicon layer 104. The stacked structure 105 and the protective layer 106 are disposed between the first polycrystalline silicon layer 104 and the second polycrystalline silicon layer 108. The doped type of the second polycrystalline silicon layer 108 may be same to the doped type of the first polycrystalline silicon layer 104, or may be different. The doped type of the second polycrystalline silicon layer 108 may be same to the doped type of the protective layer 106, or may be different. The thickness of the second polycrystalline silicon layer 108 is greater than the thickness of the protective layer 106. The second polycrystalline silicon layer 108 may be configured to form a control gate electrode of the memory. In some embodiments, the second polycrystalline silicon layer 108 is, for example, polycrystalline silicon doped with impurity, and thus having good conductivity. The doped concentration of the second polycrystalline silicon layer 108 is different from the doped concentration of the first polycrystalline silicon layer 104.

As shown in FIG. 11, in the present embodiment, the semiconductor structure 100 may be a memory, such as a flash memory, a non-volatile memory, a programmable read-only memory or an erasable programmable read only memory. The memory includes at least two layers of polycrystalline silicon layers.

Based on the above, the present disclosure provides the method for manufacturing the semiconductor structure. The method is used to form the semiconductor structure with at least two polycrystalline silicon layers. The method includes the following steps. Firstly, the first polycrystalline silicon layer and the stacked structure are formed. Then, the protective layer is formed on the stacked structure. Before the second polycrystalline silicon layer is formed, the native oxide layer may be formed on the first polycrystalline silicon layer and the protective layer, so that the protective layer can prevent the second oxide layer in the stacked structure from being reduced when the native oxide layer is removed, so that the thickness of the stacked structure is not changed. Next, after the native oxide layer is removed, the second polycrystalline silicon layer is formed on the protective layer and the first polycrystalline silicon layer. The protective layer protects the stacked structure, so that the stability of the semiconductor structure is ensured. The present disclosure further provides the semiconductor structure formed by the method. The semiconductor structure may be a memory.

Throughout the specification, "one embodiment", "an embodiment" or "a specific embodiment" means that specific features, structures or characteristics described with reference to embodiments are included in at least one embodiment of the present disclosure and not necessarily in all the embodiments. Therefore, the phrase "in one embodiment", "in an embodiment" or "in a specific embodiment" that appears in different places throughout the specification does not necessarily refer to the same embodiment. Moreover, the specific features, structures, or characteristics of any specific embodiment of the present disclosure may be combined with one or more other embodiments in any appropriate manner. It should be understood that other variations and modifications may be made to the embodiments described and shown in the present disclosure according to the teachings of the specification and shall be considered to fall within the spirit and scope of the present disclosure.

It should also be understood that one or more of the elements shown in the accompanying drawings may be implemented in a more separate or integrated manner, or even removed because they cannot be operated in some cases, or provided because they can be useful for a particular application.

In addition, unless otherwise specified, any sign arrows in the accompanying drawings should be considered as merely exemplary and not a limitation. Moreover, unless otherwise specified, the term "or" used herein is generally intended to mean "and/or". When it is unclear whether the term provides separation or combination capability, the combination of components or steps will also be considered as having been specified.

As described herein and used throughout the claims below, unless otherwise specified, "a", "an" and "the" include plural references. Similarly, as described herein and used throughout the claims below, unless otherwise specified, the meaning of "in" includes "in" and "on".

The foregoing description of the embodiments in the present disclosure (including the content described in the abstract of the specification) is not intended to perform enumeration in detail or limit the present disclosure to the precise form disclosed herein. Although specific embodiments and examples of the present disclosure are described herein for the purpose of description only, as appreciated and understood by a person skilled in the art, various equivalent modifications may be made within the spirit and scope of the present disclosure. As noted, modifications may be made to the present disclosure according to the above description of the embodiments of the present disclosure, and such modifications shall fall within the spirit and scope of the present disclosure.

For the understanding of details of the present disclosure, the system and method have been described in general. In addition, various specific details have been given to provide an overall understanding of the embodiments of the present disclosure. However, a person skilled in the relevant art will realize that the embodiments of the present disclosure may be practiced without one or more specific details or by using other apparatuses, systems, fittings, methods, components, materials, parts, and the like. In other cases, known structures, materials and/or operations are not specifically shown or described in detail to avoid confusion in all aspects of the embodiments of the present disclosure.

Therefore, although the present disclosure has been described herein with reference to its specific embodiments, various modifications, changes, and replacements are intended to fall within the above disclosure. It should be understood that, in some cases, some features of the present disclosure will be adopted in a case that other features are not correspondingly used without departing from the scope and spirit of the present disclosure. Therefore, many modifications may be made to adapt a particular environment or material to the essential scope and spirit of the present disclosure. The present disclosure is not intended to limit specific terms used in the claims below and/or specific embodiments that are disclosed as the best way to perform the present disclosure, but the present disclosure shall include any and all embodiments and equivalents falling within the scope of the appended claims. Therefore, the scope of the present disclosure shall be subject to only the appended claims.

What is claimed is:

1. A method for manufacturing a semiconductor structure, comprising:
preparing a substrate, wherein the substrate includes a first region and a second region;
forming a first polycrystalline silicon layer on the substrate, wherein the first polycrystalline silicon layer covers the first region and the second region;
after the first polycrystalline silicon layer is formed, forming a stacked structure on the first polycrystalline silicon layer, wherein the stacked structure sequentially comprises a first oxide layer, a nitride layer and a second oxide layer;

after the stacked structure is formed, forming a protective layer on the stacked structure, wherein the protective layer is disposed on an outer surface of the second oxide layer, and the protective layer is made of silicon;

forming a patterned photoresist layer on the protective layer, wherein the patterned photoresist layer exposes the protective layer in the second region;

removing the protective layer and the stacked structure in the second region to expose the first polycrystalline silicon layer in the second region;

removing the patterned photoresist layer; and forming a second polycrystalline silicon layer on the protective layer in the first region and the first polycrystalline silicon layer in the second region.

2. The method as in claim 1, wherein the protective layer is a polycrystalline silicon protective layer.

3. The method as in claim 1, wherein after the patterned photoresist layer is removed, and before the second polycrystalline silicon layer is formed, the method further comprises a reducing step for reducing a native oxide layer, wherein the native oxide layer is formed on the protective layer in the first region and the first polycrystalline silicon layer in the second region, wherein the protective layer is between the native oxide layer and the stacked structure comprised of the first oxide layer, the nitride layer, and the second oxide layer.

4. The method as in claim 1, wherein the first region is a storage region, and the second region is an operation region.

5. The method as in claim 1, wherein a thickness of the protective layer is smaller than a thickness of the first polycrystalline silicon layer, and the thickness of the protective layer is in a range of 5 nm to 10 nm.

6. The method as in claim 1, wherein before forming the first polycrystalline silicon layer, the method further comprises forming a gate oxide layer on the substrate, wherein the gate oxide layer covers the first region and the second region.

7. The method as in claim 6, wherein before forming the gate oxide layer, the method further comprises forming a shallow trench isolation structure in the substrate, wherein the shallow trench isolation structure isolates the first region from the second region.

8. A semiconductor structure manufactured according to the method as in claim 1, comprising:

a substrate, including a first region and a second region;

an isolation structure, disposed in the substrate, and isolating the first region from the second region;

a gate oxide layer, disposed on the substrate, and covering the first region and the second region;

a first polycrystalline silicon layer, disposed on the gate oxide layer;

a stacked structure, disposed on the first polycrystalline silicon layer in the first region, wherein the stacked structure sequentially comprises a first oxide layer, a nitride layer and a second oxide layer;

a protective layer, disposed on the stacked structure, wherein the protective layer is disposed on an outer surface of the second oxide layer, and the protective layer is made of silicon; and a second polycrystalline silicon layer, disposed on the protective layer and the first polycrystalline silicon layer in the second region.

* * * * *